(12) United States Patent
Saitoh et al.

(10) Patent No.: US 12,347,642 B2
(45) Date of Patent: Jul. 1, 2025

(54) SCANNING ELECTRON MICROSCOPE (71) Applicant: TASMIT, INC., Yokohama (JP)

(72) Inventors: Naoya Saitoh, Yokohama (JP); Daisuke Kubota, Yokohama (JP)

(73) Assignee: TASMIT, INC., Kanagawa (JP)

( * ) Notice: Subject to any disclaimer, the term of this patent is extended or adjusted under 35 U.S.C. 154(b) by 471 days.

(21) Appl. No.: 17/913,655

(22) PCT Filed: Mar. 18, 2021

(86) PCT No.: PCT/JP2021/011055
§ 371 (c)(1),
(2) Date: Sep. 22, 2022

(87) PCT Pub. No.: WO2021/193346
PCT Pub. Date: Sep. 30, 2021

(65) Prior Publication Data
US 2023/0109853 A1    Apr. 13, 2023

(30) Foreign Application Priority Data

Mar. 26, 2020 (JP) .................. 2020-055703

(51) Int. Cl.
*H01J 37/28* (2006.01)
*H01J 37/147* (2006.01)
(Continued)

(52) U.S. Cl.
CPC .......... *H01J 37/28* (2013.01); *H01J 37/1474* (2013.01); *H01J 37/153* (2013.01); *H01J 37/21* (2013.01);
(Continued)

(58) Field of Classification Search
CPC ...... H01J 37/28; H01J 37/1474; H01J 37/153; H01J 37/21; H01J 37/244; H01J 37/265;
(Continued)

(56) References Cited

U.S. PATENT DOCUMENTS 2,811,668 A * 10/1957 McNaney ............... H01J 29/74
315/394
4,694,178 A * 9/1987 Harte .................. H01J 37/3007
250/398

(Continued)

FOREIGN PATENT DOCUMENTS

JP        62-73712 A      4/1987
JP        10172486 A      6/1998
(Continued)

OTHER PUBLICATIONS

International Patent Application No. PCT/JP2021/011055; International Search Report and Written Opinion dated Apr. 20, 2021, 7 pgs.

*Primary Examiner* — David A Vanore
(74) *Attorney, Agent, or Firm* — Cozen O'Connor (57) ABSTRACT

The present invention relates to a scanning electron microscope configured to scan a workpiece, such as a wafer, mask, panel, or substrate, with an electron beam to generate an image of the workpiece. The scanning electron microscope includes a deflector (17, 18) configured to deflect the electron beam to scan a target region (T) on the workpiece (W) with the electron beam, and a deflection controller (22) configured to apply to the deflectors (17, 18) a scanning voltage that causes the electron beam to scan the target region (T) and an offset voltage that shifts the electron beam from an optical axial center (O) to the target region (T).

12 Claims, 7 Drawing Sheets

(51) Int. Cl.
*H01J 37/153* (2006.01)
*H01J 37/21* (2006.01)
*H01J 37/244* (2006.01)
*H01J 37/26* (2006.01)

(52) U.S. Cl.
CPC .......... *H01J 37/244* (2013.01); *H01J 37/265* (2013.01); *H01J 2237/1534* (2013.01); *H01J 2237/24475* (2013.01); *H01J 2237/2448* (2013.01)

(58) Field of Classification Search
CPC ..... H01J 2237/1534; H01J 2237/24475; H01J 2237/2448; H01J 2237/1504; H01J 2237/1536; H01J 2237/2811; H01J 37/1472
See application file for complete search history.

(56) References Cited

U.S. PATENT DOCUMENTS

| | | | | |
|---|---|---|---|---|
| 4,859,856 A * | 8/1989 | Groves | ................ | H01J 37/141 250/398 |
| 4,945,246 A * | 7/1990 | Davis | ................ | H01J 37/3026 250/398 |
| 4,969,200 A * | 11/1990 | Manns | ................ | G06T 7/33 356/400 |
| 5,689,117 A * | 11/1997 | Nakasuji | ................ | H01J 37/141 250/492.23 |
| 6,452,677 B1 * | 9/2002 | Do | ................ | G01N 21/95684 977/773 |
| 7,605,381 B2 * | 10/2009 | Sato | ................ | H01J 37/1471 250/307 |
| 7,659,507 B2 * | 2/2010 | Kawai | ................ | H01J 37/28 250/398 |
| 8,338,781 B2 * | 12/2012 | Sasaki | ................ | H01J 37/265 250/310 |
| 10,446,365 B2 * | 10/2019 | Kaneko | ................ | G06T 7/60 |
| 10,541,103 B2 * | 1/2020 | Mizuhara | ................ | H01J 37/244 |
| 10,614,999 B2 * | 4/2020 | Nakazawa | ................ | H01J 37/28 |
| 10,802,073 B2 * | 10/2020 | Shimoda | ................ | G01N 21/9505 |
| 2002/0027199 A1 * | 3/2002 | Inada | ................ | G01N 23/04 250/311 |
| 2003/0155509 A1 * | 8/2003 | Nakasuji | ................ | G01N 23/2251 250/310 |
| 2003/0209674 A1 * | 11/2003 | Hamaguchi | ................ | B82Y 40/00 250/398 |
| 2005/0023486 A1 * | 2/2005 | Takakuwa | ................ | H01J 37/3174 250/492.2 |
| 2006/0060781 A1 * | 3/2006 | Watanabe | ................ | B82Y 40/00 250/310 |
| 2006/0151698 A1 * | 7/2006 | Sasaki | ................ | H01J 37/28 250/310 |
| 2006/0169895 A1 * | 8/2006 | Honda | ................ | H01J 37/153 250/398 |
| 2007/0158576 A1 * | 7/2007 | Kamikubo | ................ | H01J 37/3174 250/398 |
| 2009/0039261 A1 * | 2/2009 | Toyoda | ................ | H01L 22/12 250/310 |
| 2009/0084953 A1 * | 4/2009 | Harada | ................ | G01N 23/225 250/307 |
| 2012/0119087 A1 * | 5/2012 | Takahashi | ................ | H01J 37/10 250/310 |
| 2016/0093466 A1 * | 3/2016 | Mizoguchi | ................ | H01J 37/10 315/14 |
| 2019/0355547 A1 * | 11/2019 | Ando | ................ | H01J 37/28 |
| 2019/0362937 A1 * | 11/2019 | Nakayamada | ................ | H01J 37/244 |

FOREIGN PATENT DOCUMENTS

| | | |
|---|---|---|
| JP | 10-247465 A | 9/1998 |
| JP | 2008-84626 A | 4/2008 |

* cited by examiner

ABERRATION-CORRECTING TABLE T1

| R1  C00 | R2  C10 | R3  C20 | R4  C30 |
|---|---|---|---|
| R5  C01 | R6  C11 | R7  C21 | R8  C31 |
| R9  C02 | R10  C12 | R11  C21 | R12  C31 |
| R13  C03 | R14  C13 | R15  C23 | R16  C33 |

ABERRATION-CORRECTING TABLE

| R1  C00 | R2  C10 | R3  C20 | R4  C30 |
|---|---|---|---|
| R5  C01 | R6  C11 | R7  C21 | R8  C31 |
| R9  C02 | R10  C12 | R11  C21 | R12  C31 |
| R13  C03 | R14  C13 | R15  C23 | R16  C33 |

FOCUS-CORRECTING TABLE

| S1 D00 | S2 D10 | S3 D20 | S4 D30 — T1 |
|---|---|---|---|
| S5 D01 | S6 D11 | S7 D21 | S8 D31 |
| S9 D02 | S10 D12 | S11 D21 | S12 D31 |
| S13 D03 | S14 D13 | S15 D23 | S16 D33 |

MX points to the table. Point O is at the center. T2 points to the box around S14/D13.

FIG. 8

FOCUS-CORRECTING TABLE

| S1 D00 | S2 D10 | S3 D20 | S4 D30 |
|---|---|---|---|
| S5 D01 | S6 D11 | S7 D21 | S8 D31 — T |
| S9 D02 | S10 D12 | S11 D21 | S12 D31 |
| S13 D03 | S14 D13 | S15 D23 | S16 D33 |

MX points to the table.

FIG. 9

ABERRATION-CORRECTING TABLE

| C00 | C10 | C20 | C30 | • | • | • | | | |
|---|---|---|---|---|---|---|---|---|---|
| C01 | C11 | C21 | • | | | C61 | C71 | C81 | |
| C02 | C12 | • | | | | C62 | C72 | C82 | |
| C03 | • | | | | | C63 | C73 | C83 | |
| • | | | | • O | | | | | |
| • | | | | | | | | | |
| • | | | | | | | | | |
| | | | C47 | C57 | | | | | • |
| | | | C48 | C58 | | | | • | • |
| | | | | | | | • | • | C99 |

T1 (upper right box), T2 (lower box), MX, O

FIG. 10

FOCUS-CORRECTING TABLE

| D00 | D10 | D20 | D30 | · | · | · |     |     |     |
|-----|-----|-----|-----|---|---|---|-----|-----|-----|
| D01 | D11 | D21 | ·   |   |   | D61 | D71 | D81 |     |
| D02 | D12 | ·   |     |   |   | D62 | D72 | D82 |     |
| D03 | ·   |     |     |   |   | D63 | D73 | D83 |     |
| ·   |     |     |     | O |   |     |     |     |     |
| ·   |     |     |     |   |   |     |     |     |     |
| ·   |     |     |     |   |   |     |     |     |     |
|     |     |     |     | D47 | D57 |     |     |     | · |
|     |     |     |     | D48 | D58 |     |     | · | · |
|     |     |     |     |     |   |     |   · | · | D99 |

T1, T2, MX

SCANNING ELECTRON MICROSCOPE

CROSS-REFERENCE TO RELATED APPLICATIONS

This application is a 35 U.S.C. § 371 filing of International Application No. PCT/JP2021/011055 filed Mar. 18, 2021, which claims the benefit of priority to Japanese Patent Application No. 2020-055703 filed Mar. 26, 2020, each of which is incorporated herein by reference in its entirety.

TECHNICAL FIELD

The present invention relates to a scanning electron microscope configured to scan a workpiece, such as a wafer, a mask, a panel, or a substrate, with an electron beam to generate an image of the workpiece.

BACKGROUND ART

A scanning electron microscope is used to inspect a pattern formed on a wafer. The scanning electron microscope is configured to move a stage holding the water until a target region on the wafer is moved to a predetermined imaging position, and generate an image of the target region by scanning the target region with an electron beam after the stage movement is completed.

Normally, a large number of target regions are set in one wafer. Therefore, when generation of an image of one target region is completed, the stage is moved until other target region is moved to the predetermined imaging position. After the moving of stage is completed, the scanning electron microscope generates an image of the other target region by scanning the target region with the electron beam. The scanning electron microscope repeats such operations to thereby generate images of the multiple target regions on one wafer.

CITATION LIST

Patent Literature

Patent document 1: Japanese laid-open patent publication No. 2008-84626

SUMMARY OF INVENTION

Technical Problem

Normally, a moving time of the stage includes a time from when the stage starts to move until when the stage stops and a minute vibration of the stage falls below a permissible level. Therefore, the moving of the stage takes a certain amount of time, and as a result, throughput may be lowered. In particular, when a large number of target regions are set on one wafer, the stage must be moved many times. As a result, a lot of time is required to complete the generation of the images of all target regions.

Thus, the present invention provides a scanning electron microscope capable of improving throughput by reducing the number of moving times of a stage.

Solution to Problem

In an embodiment, there is provided a scanning electron microscope comprising: a deflector configured to deflect an electron beam to scan a target region on a workpiece with the electron beam; a deflection controller configured to apply to the deflector a scanning voltage that causes the electron beam to scan the target region and an offset voltage that shifts the electron beam from an optical axial center to the target region; and an electron detector configured to detect electrons emitted from the workpiece, wherein the deflection controller is configured to correct the scanning voltage by multiplying an aberration-correcting coefficient by a command value of the scanning voltage, and apply the corrected scanning voltage and the offset voltage to the deflector.

In an embodiment, the deflection controller stores a plurality of aberration-correcting coefficients therein and is configured to select one aberration-correcting coefficient from the plurality of aberration-correcting coefficients based on a position of the target region and correct the scanning voltage by multiplying the selected aberration-correcting coefficient by the command value of the scanning voltage.

In an embodiment, the plurality of aberration-correcting coefficients are associated with positions of a plurality of divided regions defined in a maximum field of view of the scanning electron microscope, respectively, and the target region is smaller than each of the plurality of divided regions.

In an embodiment, the deflection controller stores a plurality of aberration-correcting coefficients therein and is configured to interpolate an aberration-correcting coefficient from the plurality of aberration-correcting coefficients based on a position of the target region and correct the scanning voltage by multiplying the interpolated aberration-correcting coefficient by the command value of the scanning voltage.

In an embodiment, the deflection controller stores a plurality of aberration-correcting coefficients therein and is configured to successively change an aberration-correcting coefficient to be selected from the plurality of aberration-correcting coefficients according to an incident position of the electron beam while correcting the scanning voltage by multiplying the selected aberration-correcting coefficient by the command value of the scanning voltage.

In an embodiment, there is provided a scanning electron microscope comprising: a deflector configured to deflect an electron beam to scan a target region on a workpiece with the electron beam; a deflection controller configured to apply to the deflector a scanning voltage that causes the electron beam to scan the target region and an offset voltage that shifts the electron beam from an optical axial center to the target region; and an electron detector configured to detect electrons emitted from the workpiece, wherein the deflection controller is configured to correct the scanning voltage by adding a focus-correcting coefficient to a command value of the scanning voltage or subtracting a focus-correcting coefficient from the command value of the scanning voltage, and apply the corrected scanning voltage and the offset voltage to the deflector.

In an embodiment, the deflection controller stores a plurality of focus-correcting coefficients therein and is configured to select one focus-correcting coefficient from the plurality of focus-correcting coefficients based on a position of the target region and correct the scanning voltage by adding the selected focus-correcting coefficient to the command value of the scanning voltage or subtracting the selected focus-correcting coefficient from the command value of the scanning voltage.

In an embodiment, the plurality of focus-correcting coefficients are associated with positions of a plurality of divided regions defined in a maximum field of view of the scanning electron microscope, respectively, and the target region is smaller than each of the plurality of divided regions.

In an embodiment, the deflection controller stores a plurality of focus-correcting coefficients therein and is configured to interpolate a focus-correcting coefficient from the plurality of focus-correcting coefficients based on a position of the target region and correct the scanning voltage by adding the interpolated focus-correcting coefficient to the command value of the scanning voltage or subtracting the interpolated focus-correcting coefficient from the command value of the scanning voltage.

In an embodiment, the deflection controller stores a plurality of focus-correcting coefficients therein and is configured to successively change a focus-correcting coefficient to be selected from the plurality of focus-correcting coefficients according to an incident position of the electron beam while correcting the scanning voltage by adding the selected focus-correcting coefficient to the command value of the scanning voltage or subtracting the selected focus-correcting coefficient from the command value of the scanning voltage.

Advantageous Effects of Invention

According to the present invention, the offset voltage is applied to the deflector in addition to the scanning voltage. The offset voltage can shift the entire scanning region of the electron beam from the optical axial center. Therefore, the scanning electron microscope can scan the target region located away from the optical axial center with the electron beam without moving the stage. As a result, the number of moving times of the stage is reduced, so that the throughput can be significantly improved.

DESCRIPTION OF EMBODIMENTS

Hereinafter, embodiments of the present invention will be described with reference to the drawings.

Figure 1:
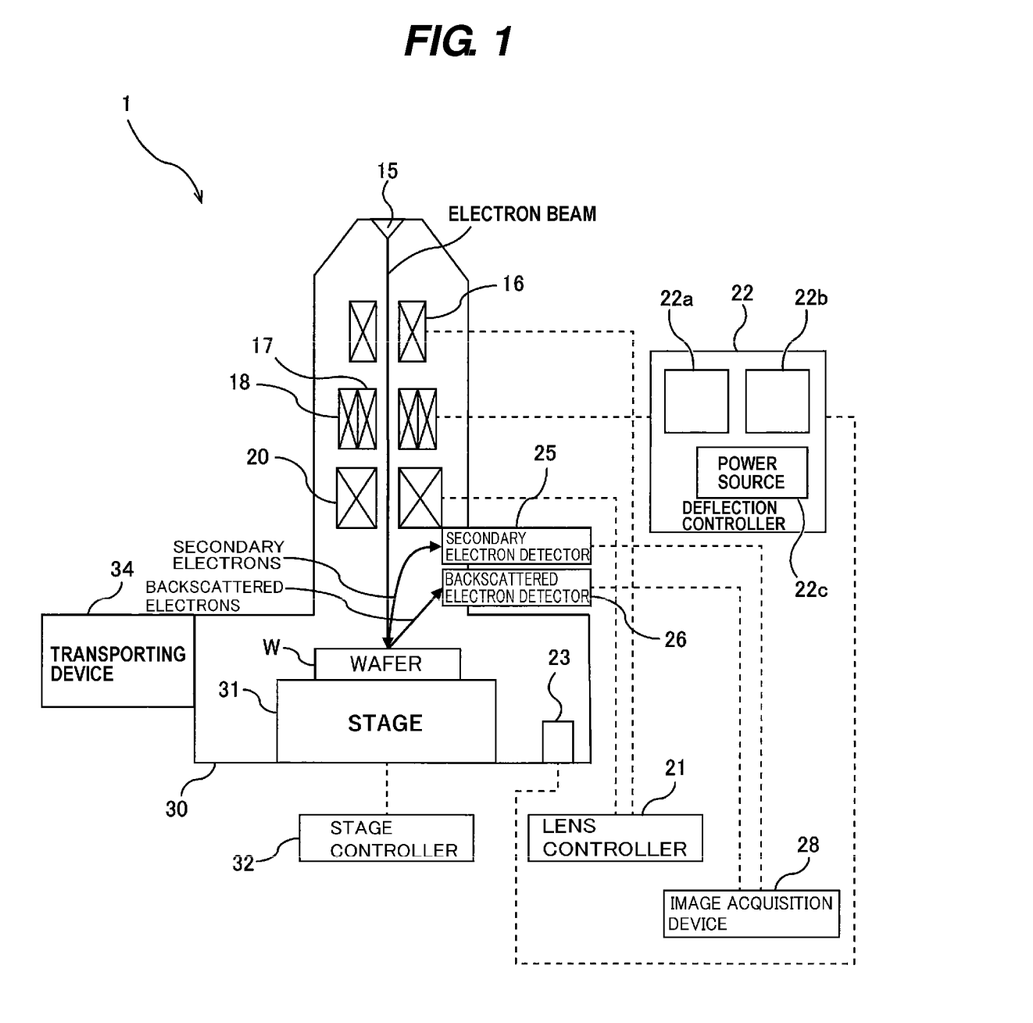
FIG. 1 is a schematic diagram showing an embodiment of a scanning electron microscope.

FIG. 1 is a schematic diagram showing an embodiment of a scanning electron microscope. A scanning electron microscope 1 is an image generating device that generates an image of a workpiece. Examples of the workpiece include a wafer, a mask, a panel, a substrate, etc., which are used in manufacturing of semiconductor devices. In the embodiments described below, a wafer is adopted as an example of the workpiece, while the present invention is not limited to the following embodiments.

The scanning electron microscope 1 includes an electron gun 15 configured to emit an electron beam, a converging lens 16 configured to converge the electron beam emitted by the electron gun 15, an X deflector 17 configured to deflect the electron beam in an X direction, a Y deflector 18 configured to deflect the electron beam in a Y direction, an objective lens 20 configured to focus the electron beam on a wafer W which is an example of the workpiece, and a stage 31 configured to support the wafer W. A configuration of the electron gun 15 is not particularly limited. For example, a field-emitter type electron gun, a semiconductor-photocathode type electron gun, etc. can be used as the electron gun 15.

The X direction and the Y direction are perpendicular to each other. The X deflector 17 and the Y deflector 18 are deflectors that deflect the electron beam. The stage 31 has an actuator (not shown) therein which is capable of moving the wafer W in the X direction and the Y direction independently. Such stage 31 is referred to as an XY stage.

The scanning electron microscope 1 further includes a stage-displacement measuring device 23 configured to measure a displacement of the stage 31. The stage-displacement measuring device 23 is configured to measure displacements of the stage 31 in the X direction and the Y direction separately. Examples of the stage-displacement measuring device 23 include two laser interferometers configured to measure the displacement of the stage 31 in the X direction and the displacement of the stage 31 in the Y direction.

The converging lens 16 and the objective lens 20 are coupled to a lens controller 21, and operations of the converging lens 16 and the objective lens 20 are controlled by the lens controller 21. The X deflector 17 and the Y deflector 18 are coupled to a deflection controller 22, and deflecting operations of the X deflector 17 and the Y deflector 18 are controlled by the deflection controller 22. The stage-displacement measuring device 23 is also coupled to the deflection controller 22, and a measured value of the displacement of the stage 31 is transmitted to the deflection controller 22. The stage 31 disposed in a chamber 30 is coupled to a stage controller 32, and an operation and a position of the stage 31 are controlled by the stage controller 32.

A secondary-electron detector 25 and a backscattered-electron detector 26 are coupled to an image acquisition device 28. The image acquisition device 28 is configured to convert electron detection signals output from the secondary-electron detector 25 and the backscattered-electron detector 26 into image(s). Each of the secondary-electron detector 25 and the backscattered-electron detector 26 is an electron detector configured to detect the electrons emitted from the wafer W. A transporting device 34 has a transfer robot (not shown) including a hand for placing the wafer W onto the stage 31 in the chamber 30 and removing the wafer W from the stage 31.

The electron beam emitted by the electron gun 15 is converged by the converging lens 16 and then focused by the objective lens 20 on a surface of the wafer W, while the electron beam is deflected by the X deflector 17 and the Y deflector 18. When the wafer W is irradiated with primary electrons of the electron beam, secondary electrons and backscattered electrons are emitted from the wafer W. The secondary electrons are detected by the secondary-electron detector 25, and the backscattered electrons are detected by the backscattered-electron detector 26. The electron detection signals of the secondary-electron detector 25 and the backscattered-electron detector 26, i.e., detection signals of the secondary electrons and detection signals of the backscattered electrons are input to the image acquisition device 28 and converted into image(s). In this way, the scanning electron microscope 1 generates the image(s) of the surface of the wafer W.

The deflection controller 22 includes at least one computer and a power source 22c, More specifically, the deflection controller 22 includes a memory 22a storing programs therein, a processor 22b configured to perform arithmetic operations according to instructions included in the programs, and the power source 22c configured to generate a voltage to be applied to the X deflector 17 and the Y deflector 18. The memory 22a includes a main memory, such as a RAM, and an auxiliary memory, such as a hard disk drive (HDD), or a solid state drive (SSD). Examples of the processor 22b include a CPU (central processing unit), a GPU (graphic processing unit), and an FPGA (field programmable gate array). However, the specific configuration of the deflection controller 22 is not limited to these examples.

The processor 22b generates a command value of a scanning voltage and a command value of an offset voltage, and transmits these command values to the power source 22c. The power source 22c is configured to generate the scanning voltage and the offset voltage according to the command values from the processor 22b, and simultaneously apply the scanning voltage and the offset voltage to the X deflector 17 and the Y deflector 18. The scanning voltage is a voltage for deflecting the electron beam so as to scan the target region on the wafer W with the electron beam. The offset voltage is a voltage for shifting the electron beam from an optical axial center to the target region.

Figure 2:
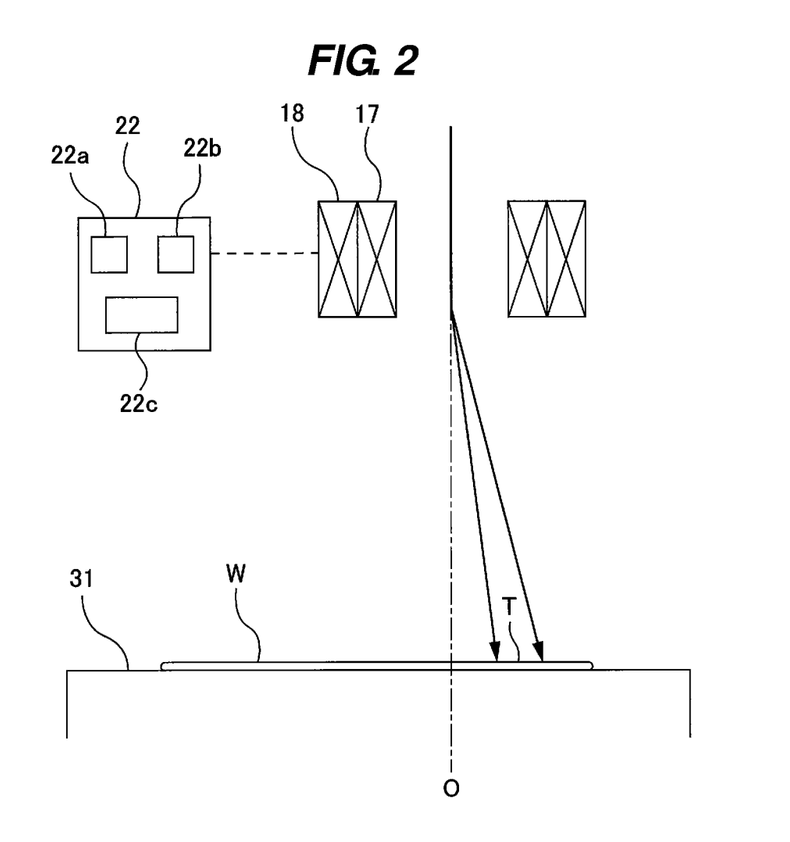
FIG. 2 is a side view schematically showing an X deflector, a Y deflector, and a wafer on a stage.
Figure 3:
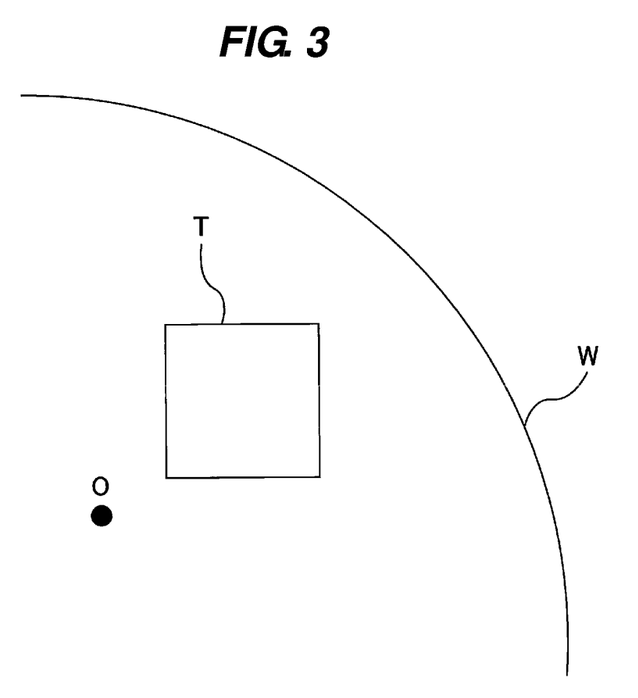
FIG. 3 is a plan view showing a target region on the wafer.

FIG. 2 is a side view schematically showing the X deflector 17, the Y deflector 18, and the wafer W on the stage 31, and FIG. 3 is a plan view showing a target region T on the wafer W. An optical axial center O corresponds to a trajectory of the electron beam when no voltage is applied to the X deflector 17 and the V deflector 18. The deflection controller 22 can shift a scanning region of the electron beam from the optical axial center O by applying the offset voltage to the X deflector 17 and the Y deflector 18.

As shown in FIG. 3, the target region T is located away from the optical axial center O. Normally, the stage 31 is moved until the optical axial center O is located within the target region T. In the present embodiment, the electron beam can scan the entire target region located away from the optical axial center O by applying the offset voltage to the X deflector 17 and the Y deflector 18 in addition to the scanning voltage without moving the stage 31.

The offset voltage is a voltage for shifting the electron beam from the optical axial center O to the target region T, and is determined based on a distance and a direction from the optical axial center O to the target region T. More specifically, the processor 22b of the deflection controller 22 calculates the distance and the direction from the optical axial center O to a predetermined point in the target region T (e.g., a central point of the target region T), and determines the command value of the offset voltage required to shift the electron beam from the optical axial center O to the target region T based on the calculated distance and the calculated direction. Then, the processor 22b transmits the command value of the offset voltage to the power source 22c. The power source 22c generates the offset voltage according to the command value of the offset voltage, and applies the offset voltage to the X deflector 17 and the Y deflector 18.

Figure 4:
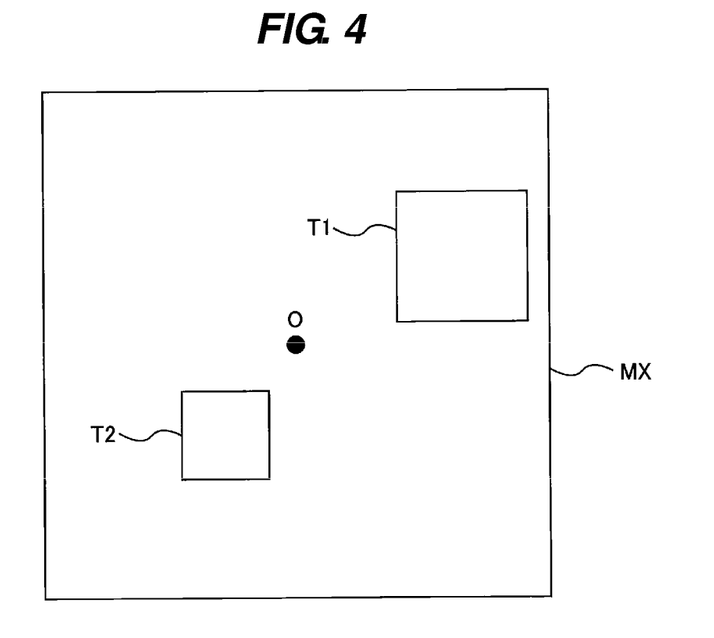
FIG. 4 is a plan view showing an example of a plurality of target regions located in a maximum field of view.

FIG. 4 is a plan view showing an example of a plurality of target regions located in a maximum field of view. The maximum field of view MX shown in FIG. 4 is a maximum range in which the electron beam can be deflected by the X deflector 17 and the Y deflector 18. In other words, the scanning electron microscope 1 can generate an image of the target region without moving the stage 31 as long as the target region is located within the maximum field of view MX. As shown in FIG. 4, the optical axial center O is located at the center of the maximum field of view MX.

The scanning electron microscope 1 generates images of a first target region T1 and a second target region T2 located away from the optical axial center O as follows. First, the stage 31 supporting the wafer W is moved to a predetermined imaging position so as to locate the first target region T1 and the second target region T2 within the maximum field of view MX. While the electron gun 15 emits the electron beam, the deflection controller 22 applies the scanning voltage and a first offset voltage, which shifts the electron beam from the optical axial center O to the first target region T1, to the X deflector 17 and the Y deflector 18 so that the electron beam scans the first target region T1. During scanning of the first target region T1 with the electron beam, the scanning voltage changes while the first offset voltage is constant.

By irradiating the first target region T1 with the electron beam, the secondary electrons and the backscattered electrons are emitted from the wafer W. The secondary electrons and the backscattered electrons are detected by the secondary-electron detector 25 and the backscattered-electron detector 26 which are electron detectors. The electron detection signals, i.e., the detection signals of the secondary electrons and the detection signals of the backscattered electrons are transmitted to the image acquisition device 28, and the image acquisition device 28 generates image(s) of the first target region T1 from the detection signals of the secondary electrons and the detection signals of the backscattered electrons.

Next, while the stage 31 is maintained at the predetermined imaging position (i.e., without moving the stage 31), the deflection controller 22 applies the scanning voltage and a second offset voltage, which shifts the electron beam from the optical axial center O to the second target region T2, to the X deflector 17 and the Y deflector 18 so that the electron beam scans the second target region T2. During scanning of the second target region T2 with the electron beam, the scanning voltage changes while the second offset voltage is constant.

By irradiating the second target region T2 with an electron beam, the secondary electrons and the backscattered electrons are emitted from the wafer W. The secondary electrons and the backscattered electrons are detected by the secondary-electron detector 25 and the backscattered-electron detector 26 which are electron detectors. The electron detection signals, i.e., the detection signals of the secondary electrons and the detection signals of the backscattered electrons are transmitted to the image acquisition device 28, and the image acquisition device 28 generates image(s) of the second target region T2 from the detection signals of the secondary electrons and the detection signals of the backscattered electrons.

In this way, the scanning electron microscope 1 can scan the target regions T1 and T2 located away from the optical axial center O with the electron beam without moving the stage 31. As a result, the number of moving times of the stage 31 is reduced, so that throughput can be significantly improved. The scanning electron microscope 1 can further generate an image of another target region without moving the stage 31 as long as the target region is located within the maximum field of view MX.

When the electron beam is largely deviated from the optical axial center O by the application of the offset voltage, aberration may occur. Thus, in one embodiment, the scanning electron microscope 1 is configured to correct the aberration as follows.

The deflection controller 22 stores a plurality of aberration-correcting coefficients for correcting aberrations in the memory 22a. The deflection controller 22 is configured to select one aberration-correcting coefficient from the plurality of aberration-correcting coefficients, correct the scanning voltage by multiplying the selected aberration-correcting coefficient by the command value of the scanning voltage, and apply the corrected scanning voltage and the offset voltage to the X deflector 17 and the Y deflector 18. More specifically, the processor 22b selects one aberration-correcting coefficient from the plurality of aberration-correcting coefficients stored in the memory 22a, corrects the command value of the scanning voltage by multiplying the selected aberration-correcting coefficient by the command value of the scanning voltage, and transmits the corrected command value to the power source 22c. The power source 22c generates a corrected scanning voltage according to the corrected command value, and applies the corrected scanning voltage and the offset voltage to the X deflector 17 and the Y deflector 18. In one embodiment, the deflection controller 22 may select one aberration-correcting coefficient from the plurality of aberration-correcting coefficients, and correct the scanning voltage by adding the selected aberration-correcting coefficient to the command value of the scanning voltage or subtracting the selected aberration-correcting coefficient from the command value of the scanning voltage.

The aberration is caused by the deflection of the electron beam from the optical axial center O. Therefore, a degree of the aberration may vary depending on a position of the target region relative to the optical axial center O. Thus, in one embodiment, the deflection controller 22 is configured to select the aberration-correcting coefficient based on the position of the target region. More specifically, the deflection controller 22 is configured to select one aberration-correcting coefficient from the plurality of aberration-correcting coefficients stored in the memory 22a based on the position of the target region.

Figure 5:
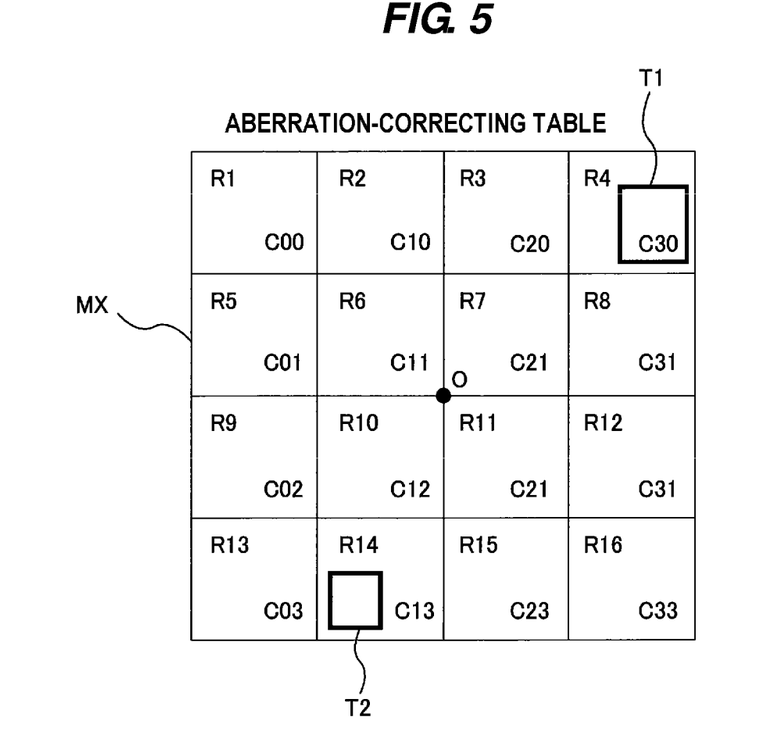
FIG. 5 is a schematic diagram showing an example of an aberration-correcting table.

An aberration-correcting table representing a relationship between the plurality of aberration-correcting coefficients and positions in the maximum field of view MX is stored in the memory 22a. FIG. 5 is a schematic diagram showing an example of the aberration-correcting table. As shown in FIG. 5, the aberration-correcting table includes a plurality of aberration-correcting coefficients C00 to C33 arrayed in the maximum field of view MX. These aberration-correcting coefficients C00 to C33 are associated with positions of a plurality of divided regions R1 to R16 defined in the maximum field of view MX, respectively. The plurality of divided regions R1 to R16 have the same shape and the same size, and are distributed over the entire maximum field of view MX. In the present embodiment, the plurality of aberration-correcting coefficients C00 to C33 arrayed in a matrix in the maximum field of view MX are allocated to the plurality of divided regions R1 to R16 distributed in a matrix in the maximum field of view MX, respectively. The plurality of aberration-correcting coefficients C00 to C33 are predetermined based on distances from the optical axial center O and other factor(s).

The target regions T1 and T2 are located in the maximum field of view MX. Each size of the target regions T1 and T2 is limited within a preset size. More specifically, each of the target regions T1 and T2 is smaller than each divided region defined in the maximum field of view MX.

The deflection controller 22 selects one aberration-correcting coefficient from the plurality of aberration-correcting coefficients in the aberration-correcting table based on the position of the target region T1. In the example shown in FIG. 5, the aberration-correcting coefficient corresponding to the position of the target region T1 is C30. The deflection controller 22 selects one aberration-correcting coefficient C30 from the aberration-correcting coefficients C00 to C33 based on the position of the target region T1. The deflection controller 22 corrects the scanning voltage by multiplying the selected aberration-correcting coefficient C30 by the command value of the scanning voltage, and applies the corrected scanning voltage and the offset voltage to the X deflector 17 and the Y deflector 18.

According to the present embodiment, the scanning voltage is corrected based on the position of the target region T1, so that the aberration can be reduced or eliminated. The aberration-correcting table is not limited to the example shown in FIG. 5. The number of the plurality of matrix-arrayed aberration-correcting coefficients included in the aberration-correcting table may be smaller or larger than that of the embodiment shown in FIG. 5.

In another target region T2 shown in FIG. 5, an aberration-correcting coefficient C13 different from the aberration-correcting coefficient C30 in the target region T1 is used. According to the present embodiment, the deflection controller 22 can correct the aberrations by using the aberration-correcting coefficients different for each target region. In particular, according to the present embodiment, during scanning of one target region with the electron beam, only one fixed aberration-correcting coefficient is used to correct the scanning voltage, so that the deflection controller 22 does not require reading out other aberration-correcting coefficients from the memory 22a during scanning. As a result, the throughput can be improved.

Figure 6:
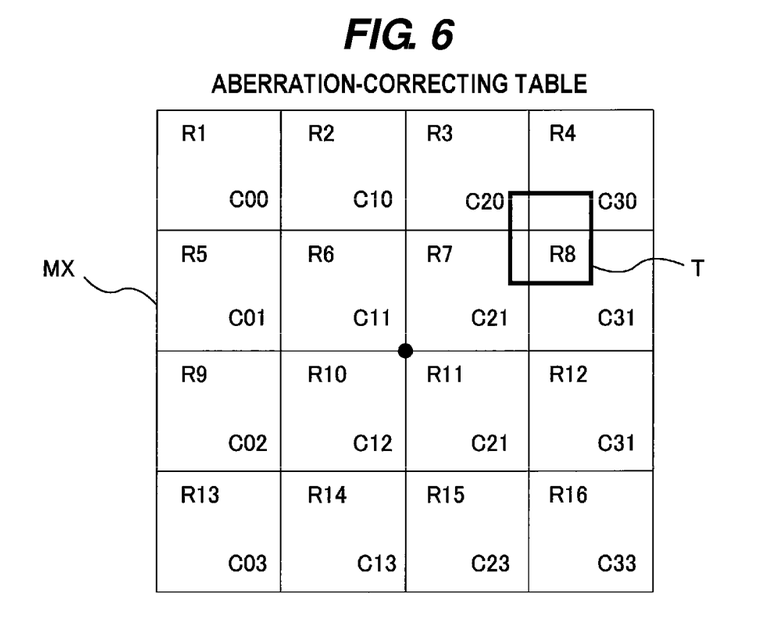
FIG. 6 is a diagram illustrating an embodiment of interpolating an aberration-correcting coefficient.

As shown in FIG. 6, when the target region T is located across a plurality of divided regions, the deflection controller 22 interpolates an aberration-correcting coefficient by using a plurality of aberration-correcting coefficients allocated to the plurality of divided regions overlapping the target region T. In the example shown in FIG. 7, the divided regions overlapping the target region T are R3, R4, R7, and R8, and the aberration-correcting coefficients corresponding to these divided regions R3, R4, R7, and R8 are C20, C30, C21, and C31. The deflection controller 22 interpolates an aberration-correcting coefficient by using these aberration-correcting coefficients C20, C30, C21, and C31. Examples of a specific method of interpolating the aberration-correcting coefficient include a weighted interpolation method and a triangulation interpolation method.

When the electron beam is largely deviated from the optical axial center O by applying the offset voltage, defocus may occur. Thus, in one embodiment, the scanning electron microscope 1 is configured to correct a focus as follows.

The deflection controller 22 stores a plurality of focus-correcting coefficients for correcting the focus in the memory 22a. The deflection controller 22 is configured to select one focus-correcting coefficient from the plurality of focus-correcting coefficients, correct the scanning voltage by adding the selected focus-correcting coefficient to the command value of the scanning voltage or subtracting the selected focus-correcting coefficient from the command value of the scanning voltage, and apply the corrected scanning voltage and the offset voltage to the X deflector 17 and the Y deflector 18. More specifically, the processor 22b selects one focus-correcting coefficient from the plurality of focus-correcting coefficients stored in the memory 22a, corrects the command value of the scanning voltage by adding the selected focus-correcting coefficient to the command value of the scanning voltage or subtracting the selected focus-correcting coefficient from the command value of the scanning voltage, and transmits the corrected command value to the power source 22c. The power source 22c generates a corrected scanning voltage according to the corrected command value, and applies the corrected scanning voltage and the offset voltage to the X deflector 17 and the Y deflector 18.

The defocus occurs due to the deflection of the electron beam from the optical axial center O. Therefore, a degree of the defocus may vary depending on the position of the target region relative to the optical axial center O. Thus, in one embodiment, the deflection controller 22 is configured to select the focus-correcting coefficient based on the position of the target region. More specifically, the deflection controller 22 is configured to select one focus-correcting coefficient from the plurality of focus-correcting coefficients stored in the memory 22a based on the position of the target region.

Figure 7:
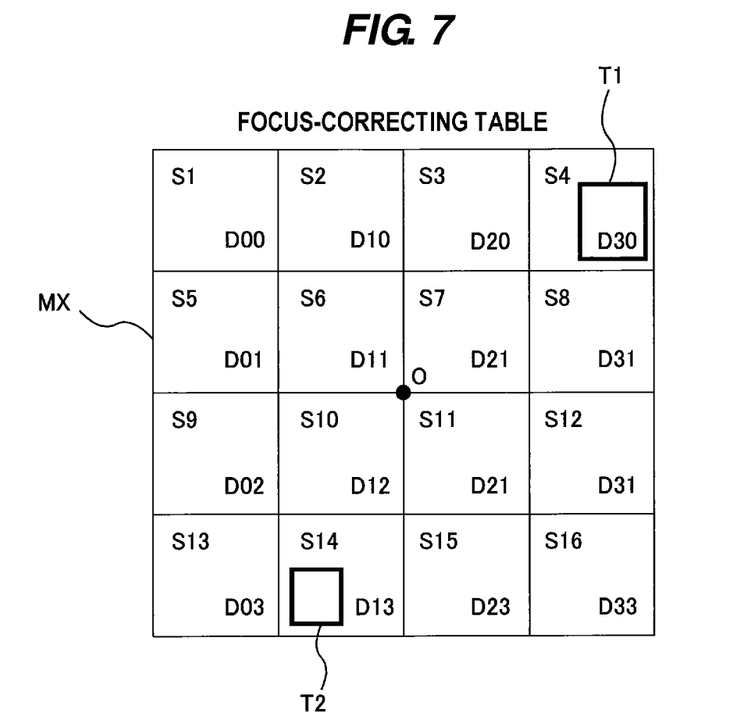
FIG. 7 is a schematic diagram showing an example of a focus-correcting table.

A focus-correcting table representing a relationship between the plurality of focus-correcting coefficients and positions in the maximum field of view MX is stored in the memory 22a. FIG. 7 is a schematic diagram showing an example of the focus-correcting table. As shown in FIG. 7, the focus-correcting table includes a plurality of focus-correcting coefficients D00 to D33 arrayed in the maximum field of view MX. These focus-correcting coefficients D00 to D33 are associated with positions of a plurality of divided regions S1 to S16 defined in the maximum field of view MX, respectively. The plurality of divided regions S1 to S16 have the same shape and the same size, and are distributed over the entire maximum field of view MX. In the present embodiment, the plurality of focus-correcting coefficients D00 to D33 arrayed in a matrix in the maximum field of view MX are allocated to the plurality of divided regions S1 to S16 distributed in a matrix in the maximum field of view MX, respectively. The plurality of focus-correcting coefficients D00 to D33 are predetermined based on distances from the optical axial center O and other factor(s).

The target regions T1 and T2 are located in the maximum field of view MX. Each size of the target regions T1 and T2 is limited within a preset size. More specifically, each of the target regions T1 and T2 is smaller than each divided region defined in the maximum field of view MX.

The deflection controller 22 selects one focus-correcting coefficient from the plurality of focus-correcting coefficients in the focus-correcting table based on the position of the target region T1. In the example shown in FIG. 7, the focus-correcting coefficient corresponding to the position of the target region T1 is D30. The deflection controller 22 selects one focus-correcting coefficient D30 from the focus-correcting coefficients D00 to D33 based on the position of the target region T1. The deflection controller 22 corrects the scanning voltage by adding the selected focus-correcting coefficient D30 to the command value of the scanning voltage or subtracting the selected focus-correcting coefficient D30 from the command value of the scanning voltage, and applies the corrected scanning voltage and the offset voltage to the X deflector 17 and the Y deflector 18.

According to the present embodiment, since the scanning voltage is corrected based on the position of the target region T1, the defocus can be reduced or eliminated. The focus-correcting table is not limited to the example shown in FIG. 7. The number of the plurality of matrix-arrayed focus-correcting coefficients included in the focus-correcting table may be smaller or larger than that of the embodiment shown in FIG. 7.

In another target region T2 shown in FIG. 7, a focus-correcting coefficient D13 different from the focus-correcting coefficient D30 in the target region T1 is used. According to the present embodiment, the deflection controller 22 can correct the focus by using the focus-correcting coefficient different for each target region. In particular, according to the present embodiment, during scanning of one target region with the electron beam, only one fixed focus-correcting coefficient is used to correct the scanning voltage, so that the deflection controller 22 does not require reading out other focus-correcting coefficients from the memory 22a during scanning. As a result, the throughput can be improved.

Figure 8:
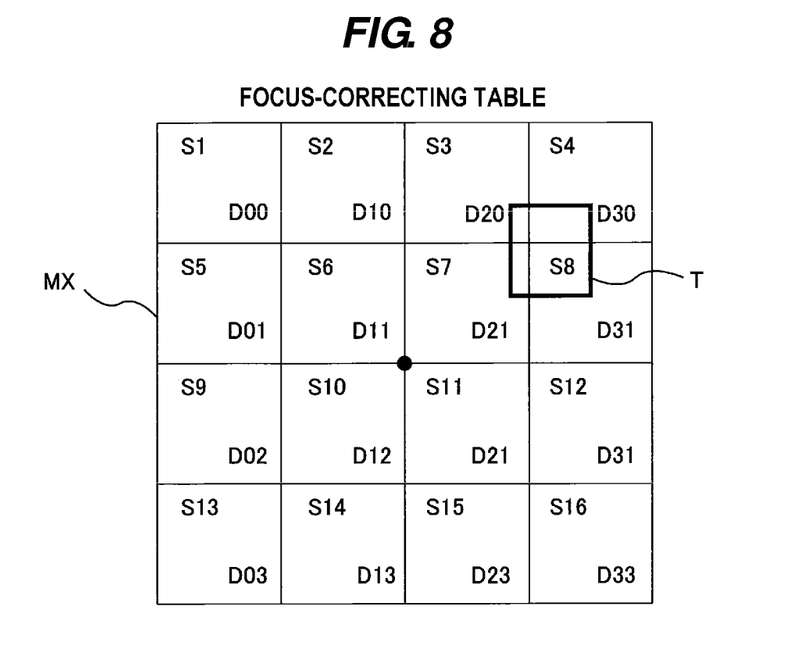
FIG. 8 is a diagram illustrating an embodiment of interpolating a focus-correcting coefficient.

As shown in FIG. 8, when the target region T is located across a plurality of divided regions, the deflection controller 22 interpolates a focus-correcting coefficient by using a plurality of focus-correcting coefficients allocated to the plurality of divided regions overlapping the target region T. In the example shown in FIG. 7, the divided regions overlapping the target region T are S3, S4, S7, and S8, and the focus-correcting coefficients allocated to these divided regions S3, S4, S7, and S8 are D20, D30, D21, and D31. The deflection controller 22 interpolates a focus-correcting coefficient by using these focus-correcting coefficients D20, D30, D21, and D31. Examples of a specific method of interpolating the focus-correcting coefficient include a weighted interpolation method and a triangulation interpolation method.

The deflection controller 22 may store both the aberration-correcting table shown in FIG. 5 and the focus-correcting table shown in FIG. 7 in the memory 22a. The deflection controller 22 selects one aberration-correcting coefficient from the plurality of aberration-correcting coefficients or interpolates one aberration-correcting coefficient from a plurality of aberration-correcting coefficients, based on the position of the target region. Further, the deflection controller 22 selects one focus-correcting coefficient from the plurality of focus-correcting coefficients or interpolates one focus-correcting coefficient from a plurality of focus-correcting coefficients, based on the position of the target region. Then, the deflection controller 22 corrects the command value of the scanning voltage by multiplying the command value of the scanning voltage by the selected or interpolated aberration-correcting coefficient, corrects the scanning voltage by adding the selected or interpolated focus-correcting coefficient to the corrected command value (or by subtracting the selected or interpolated focus-correcting coefficient from the corrected command value). The deflection controller 22 applies the corrected scanning voltage and the offset voltage to the X deflector 17 and the Y deflector 18.

According to the present embodiment, the deflection controller 22 can reduce or eliminate both the aberration and the defocus by using both the aberration-correcting coefficient and the focus-correcting coefficient.

The degree of aberration may vary depending on an incident position of the electron beam on the target region. Thus, in one embodiment, the deflection controller 22 is configured to change the aberration-correcting coefficient according to the incident position of the electron beam in the target region. More specifically, the deflection controller 22 is configured to select one aberration-correcting coefficient from a plurality of aberration-correcting coefficients stored in the memory 22*a* based on the incident position of the electron beam in the target region.

Figure 9:
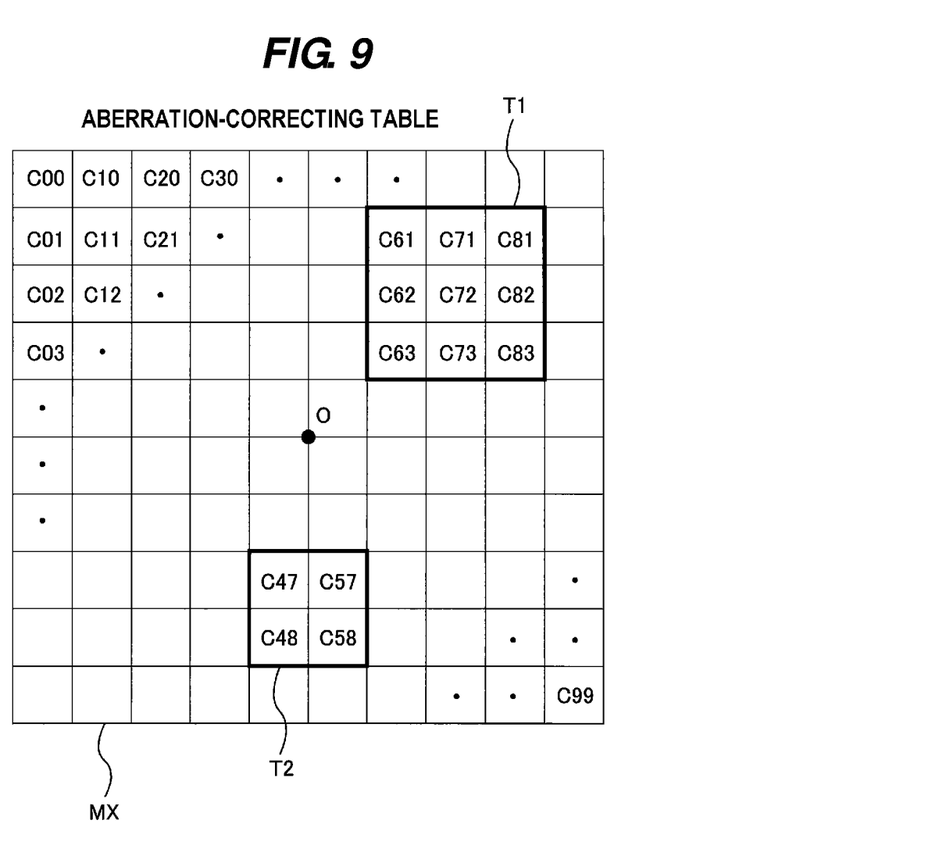
FIG. 9 is a schematic diagram showing another example of the aberration-correcting table.

An aberration-correcting table showing a relationship between the plurality of aberration-correcting coefficients and positions in the maximum field of view MX is stored in the memory 22*a*. FIG. 9 is a schematic diagram showing an example of the aberration-correcting table. As shown in FIG. 9, the aberration-correcting table includes a plurality of aberration-correcting coefficients C00 to C99 arrayed in the maximum field of view MX. These aberration-correcting coefficients C00 to C99 are associated with a plurality of positions defined in the maximum field of view MX, respectively. In the present embodiment, the plurality of aberration-correcting coefficients C00 to C99 arrayed in a matrix in the maximum field of view MX correspond to the plurality of positions distributed in a matrix in the maximum field of view MX, respectively. The plurality of aberration-correcting coefficients C00 to C99 are predetermined based on distances from the optical axial center O and other factor(s).

A target region T1 is located in the maximum field of view MX. The deflection controller 22 selects one aberration-correcting coefficient from the plurality of aberration-correcting coefficients in the aberration-correcting table based on the incident position of the electron beam in the target region T1. In the example shown in FIG. 9, the aberration-correcting coefficients corresponding to respective positions in the target region T1 are C61 to C83. The deflection controller 22 selects one aberration-correcting coefficient from the aberration-correcting coefficients C61 to C83 based on an incident position of the electron beam in the target region T1. Specifically, the deflection controller 22 successively changes the aberration-correcting coefficient according to the incident position of the electron beam while the electron beam is scanning the target region T1. The deflection controller 22 corrects the scanning voltage by multiplying the selected aberration-correcting coefficient by the command value of the scanning voltage, and applies the corrected scanning voltage and the offset voltage to the X deflector 17 and the Y deflector 18.

According to the present embodiment, the deflection controller 22 corrects the scanning voltage by multiplying the selected aberration-correcting coefficient by the command value of the scanning voltage while successively changing the aberration-correcting coefficient to be selected from the plurality of aberration-correcting coefficients according to the incident position of the electron beam. Since the scanning voltage is corrected according to the incident position of the electron beam, the aberration can be reduced or eliminated. The aberration-correcting table is not limited to the example shown in FIG. 9. The number of the plurality of matrix-arrayed aberration-correcting coefficients included in the aberration-correcting table may be larger than that of the embodiment shown in FIG. 9. Generally, the larger the number of the aberration-correcting coefficients included in the aberration-correcting table, the finer the aberration can be corrected.

In another target region T2 shown in FIG. 9, aberration-correcting coefficients C47 to C58 different from the aberration-correcting coefficients C61 to C83 in the target region T are used. According to the present embodiment, the deflection controller 22 can correct the aberration by using a different set of aberration-correcting coefficients for each target region.

In one embodiment, the deflection controller 22 is configured to change the focus-correcting coefficient according to the incident position of the electron beam in the target region. More specifically, the deflection controller 22 is configured to select one focus-correcting coefficient from a plurality of focus-correcting coefficients stored in the memory 22*a* based on the incident position of the electron beam in the target region.

Figure 10:
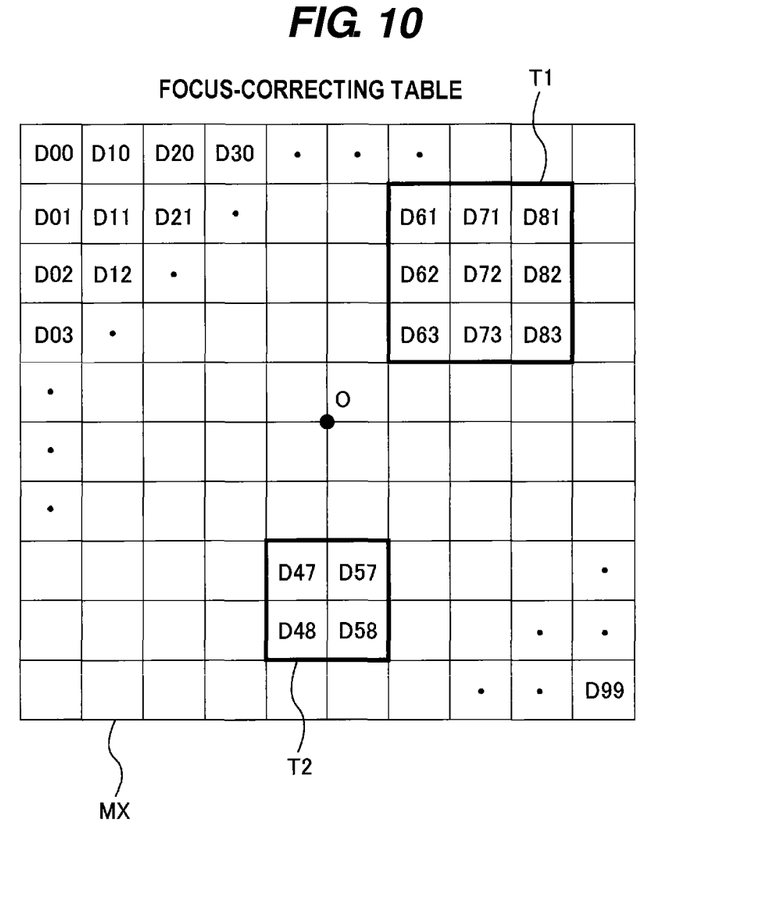
FIG. 10 is a schematic diagram showing another example of the focus-correcting table.

A focus-correcting table showing a relationship between the plurality of focus-correcting coefficients and positions in the maximum field of view MX is stored in the memory 22*a*. FIG. 10 is a schematic diagram showing an example of the focus-correcting table. As shown in FIG. 10, the focus-correcting table includes a plurality of focus-correcting coefficients D00 to D99 arrayed in the maximum field of view MX. These focus-correcting coefficients D00 to D99 are associated with a plurality of positions defined in the maximum field of view MX, respectively. In the present embodiment, the plurality of focus-correcting coefficients D00 to D99 arrayed in a matrix in the maximum field of view MX correspond to the plurality of positions distributed in a matrix in the maximum field of view MX, respectively. The plurality of focus-correcting coefficients D00 to D99 are predetermined based on distances from the optical axial center O and other factor(s).

A target region T1 is located in the maximum field of view MX. The deflection controller 22 selects one focus-correcting coefficient from the plurality of focus-correcting coefficients in the focus-correcting table based on an incident position of the electron beam in the target region T1. In the example shown in FIG. 10, the focus-correcting coefficients corresponding to respective positions in the target region T1 are D61 to D83. The deflection controller 22 selects one focus-correcting coefficient from the focus-correcting coefficients D61 to D83 based on the incident position of the electron beam in the target region T1. Specifically, the deflection controller 22 successively changes the focus-correcting coefficient according to the incident position of the electron beam while the electron beam is scanning, the target region T1. The deflection controller 22 corrects the scanning voltage by adding the selected focus-correcting coefficient to the command value of the scanning voltage or subtracting the selected focus-correcting coefficient from the command value of the scanning voltage, and applies the corrected scanning voltage and the offset voltage to the X deflector 17 and the Y deflector 18.

According to the present embodiment, the deflection controller 22 corrects the scanning voltage by adding the selected focus-correcting coefficient to the command value of the scanning voltage or subtracting the selected focus-correcting coefficient from the command value of the scanning voltage while successively changing the focus-correcting coefficient to be selected from the plurality of focus-correcting coefficients according to the incident position of the electron beam. Since the scanning voltage is corrected according to the incident position of the electron beam, the defocus can be reduced or eliminated. FIG. 10 shows one example of the focus-correcting table, and the focus-correcting table is not limited to the embodiment shown in FIG. 10. The number of the plurality of matrix-arrayed focus-correcting coefficients included in the focus-correcting table may be larger than that of the embodiment shown in FIG. 10.

Generally, the larger the number of focus-correcting coefficients included in the focus-correcting table, the finer the focus can be corrected.

In another target region T2 shown in FIG. 10, focus-correcting coefficients D47 to D58 different from the focus-correcting coefficients D61 to D83 in the target region T1 are used. According to the present embodiment, the deflection controller 22 can correct the focus by using a different set of focus-correcting coefficients for each target region.

The deflection controller 22 may store both the aberration-correcting table shown in FIG. 9 and the focus-correcting table shown in FIG. 10 in the memory 22a. In the examples shown in FIGS. 9 and 10, the deflection controller 22 selects one aberration-correcting coefficient from the aberration-correcting coefficients C61 to C83 based on the incident position of the electron beam in the target region T1. Further, the deflection controller 22 selects one focus-correcting coefficient from the focus-correcting coefficients D61 to D83 based on the incident position of the electron beam in the target region T1. The deflection controller 22 corrects the command value of the scanning voltage by multiplying the selected aberration-correcting coefficient by the command value of the scanning voltage, and corrects the scanning voltage by adding the selected focus-correcting coefficient to the corrected command value (or by subtracting the selected focus-correcting coefficient from the corrected command value). The deflection controller 22 applies the corrected scanning voltage and the offset voltage to the X deflector 17 and the Y deflector 18.

In the target region T2, the deflection controller 22 selects one aberration-correcting coefficient from the aberration-correcting coefficients C47 to C58 based on the incident position of the electron beam in the target region T2. Further, the deflection controller 22 selects one focus-correcting coefficient from the focus-correcting coefficients D47 to D58 based on the incident position of the electron beam in the target region T2. The deflection controller 22 corrects the command value of the scanning voltage by multiplying the selected aberration-correcting coefficient by the command value of the scanning voltage, and corrects the scanning voltage by adding the selected focus-correcting coefficient to the corrected command value (or by subtracting the selected focus-correcting coefficient from the corrected command value). The deflection controller 22 applies the corrected scanning voltage and the offset voltage to the X deflector 17 and the Y deflector 18.

According to the present embodiment, the deflection controller 22 can reduce or eliminate both the aberration and the defocus by using both the aberration-correcting coefficient and the focus-correcting coefficient.

In one embodiment, the deflection controller 22 may be configured to determine a correcting voltage based on the measured value of the displacement of the stage 31 and further apply the correcting voltage to the X deflector 17 and the Y deflector 18. Hereinafter, this embodiment will be described.

The stage 31 shown in FIG. 1 is mainly made of metal. Since a vacuum is formed in the chamber 30, a temperature in the chamber 30 is likely to rise. In particular, since the stage 31 has therein the actuator (not shown) for moving in the X direction and the Y direction, the stage 31 itself may be a heat source. When the temperature of the stage 31 rises, the stage 31 itself may thermally expand and the position of the target region of the wafer W on the stage 31 may change. Thus, in the present embodiment, the deflection controller 22 is configured to determine the correcting voltage based on the measured value of the displacement of the stage 31 transmitted from the stage-displacement measuring device 23 and apply the correcting voltage, together with the above-described scanning voltage (or the corrected scanning voltage) and the offset voltage, to the X deflector 17 and the Y deflector 18. The correcting voltage changes according to a displacement amount of the stage 31. Generally, the larger the displacement amount of the stage 31, the larger the correcting voltage. The deflection controller 22 stores correlation data (i.e., a correlation formula or a correlation table) representing a relationship between the displacement amount of the stage 31 and the correcting voltage in the memory 22a. The deflection controller 22 determines the correcting voltage from the correlation data and the measured value of the displacement of the stage 31 transmitted from the stage-displacement measuring device 23.

According to the present embodiment, the scanning electron microscope 1 can generate an image of the target region based on the correct position of the target region on the wafer W.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a scanning electron microscope configured to scan a workpiece, such as a wafer, mask, panel, or substrate, with an electron beam to generate an image of the workpiece.

REFERENCE SIGNS LIST 1 scanning electron microscope
15 electron gun
16 converging lens
17 X deflector
18 Y deflector
20 objective lens
21 lens controller
22 deflection controller
22a memory
22b processor
22c power source
23 stage-displacement measuring device
25 secondary-electron detector
26 backscattered-electron detector
28 image acquisition device
30 chamber
31 stage
32 stage controller
34 transporting device

The invention claimed is:
1. A scanning electron microscope comprising:
a stage configured to support a workpiece;
a deflector configured to deflect an electron beam to scan a target region on the workpiece with the electron beam;
a deflection controller configured to apply a scanning voltage that causes the electron beam to scan the target region and an offset voltage that shifts the electron beam from an optical axial center to the target region to the deflector; and an electron detector configured to detect electrons emitted from the workpiece, wherein the deflection controller is configured to correct the scanning voltage by multiplying an aberration-correcting coefficient by a command value of the scanning voltage, apply the corrected scanning voltage and the offset voltage to the deflector to cause the electron beam to scan the target region, and change the aberration-correcting coefficient and the offset voltage to allow the deflector to scan another target region with the electron beam without moving the stage.

2. The scanning electron microscope according to claim 1, wherein the deflection controller stores a plurality of aberration-correcting coefficients therein and is configured to select one aberration-correcting coefficient from the plurality of aberration-correcting coefficients based on a position of the target region and correct the scanning voltage by multiplying the selected aberration-correcting coefficient by the command value of the scanning voltage.

3. The scanning electron microscope according to claim 2, wherein the plurality of aberration-correcting coefficients are associated with positions of a plurality of divided regions defined in a maximum field of view of the scanning electron microscope, respectively, and the target region is smaller than each of the plurality of divided regions.

4. The scanning electron microscope according to claim 1, wherein the deflection controller stores a plurality of aberration-correcting coefficients therein and is configured to interpolate an aberration-correcting coefficient from the plurality of aberration-correcting coefficients based on a position of the target region and correct the scanning voltage by multiplying the interpolated aberration-correcting coefficient by the command value of the scanning voltage.

5. The scanning electron microscope according to claim 1, wherein the deflection controller stores a plurality of aberration-correcting coefficients therein and is configured to successively change an aberration-correcting coefficient to be selected from the plurality of aberration-correcting coefficients according to an incident position of the electron beam while correcting the scanning voltage by multiplying the selected aberration-correcting coefficient by the command value of the scanning voltage.

6. A scanning electron microscope comprising:
a stage configured to support a workpiece;
a deflector configured to deflect an electron beam to scan a target region on the workpiece with the electron beam;
a deflection controller configured to apply to the deflector a scanning voltage that causes the electron beam to scan the target region and an offset voltage that shifts the electron beam from an optical axial center to the target region; and
an electron detector configured to detect electrons emitted from the workpiece,
wherein the deflection controller is configured to correct the scanning voltage by adding a focus-correcting coefficient to a command value of the scanning voltage or subtracting a focus-correcting coefficient from the command value of the scanning voltage, apply the corrected scanning voltage and the offset voltage to the deflector to cause the electron beam to scan the target region, and change the focus-correcting coefficient and the offset voltage to allow the deflector to scan another target region with the electron beam without moving the stage.

7. The scanning electron microscope according to claim 6, wherein the deflection controller stores a plurality of focus-correcting coefficients therein and is configured to select one focus-correcting coefficient from the plurality of focus-correcting coefficients based on a position of the target region and correct the scanning voltage by adding the selected focus-correcting coefficient to the command value of the scanning voltage or subtracting the selected focus-correcting coefficient from the command value of the scanning voltage.

8. The scanning electron microscope according to claim 7, wherein the plurality of focus-correcting coefficients are associated with positions of a plurality of divided regions defined in a maximum field of view of the scanning electron microscope, respectively, and the target region is smaller than each of the plurality of divided regions.

9. The scanning electron microscope according to claim 6, wherein the deflection controller stores a plurality of focus-correcting coefficients therein and is configured to interpolate a focus-correcting coefficient from the plurality of focus-correcting coefficients based on a position of the target region and correct the scanning voltage by adding the interpolated focus-correcting coefficient to the command value of the scanning voltage or subtracting the interpolated focus-correcting coefficient from the command value of the scanning voltage.

10. The scanning electron microscope according to claim 6, wherein the deflection controller stores a plurality of focus-correcting coefficients therein and is configured to successively change a focus-correcting coefficient to be selected from the plurality of focus-correcting coefficients according to an incident position of the electron beam while correcting the scanning voltage by adding the selected focus-correcting coefficient to the command value of the scanning voltage or subtracting the selected focus-correcting coefficient from the command value of the scanning voltage.

11. An image generating method comprising:
placing a workpiece having a first target region and a second target region on a stage;
scanning the first target region with an electron beam by applying to a deflector a scanning voltage, which has been corrected by multiplying a first aberration-correcting coefficient by a command value of a scanning voltage, and a first offset voltage that shifts the electron beam from an optical axial center to the first target region;
detecting electrons emitted from the first target region by an electron detector;
scanning the second target region with the electron beam without moving the stage by applying to the deflector a scanning voltage, which has been corrected by multiplying a second aberration-correcting coefficient by the command value of the scanning voltage, and a second offset voltage that shifts the electron beam from the optical axial center to the second target region; and
detecting electrons emitted from the second target region by the electron detector.

12. An image generating method comprising:
placing a workpiece having a first target region and a second target region on a stage;
scanning the first target region with an electron beam by applying to a deflector a scanning voltage, which has been corrected by adding a first focus-correcting coefficient to a command value of a scanning voltage or subtracting a first focus-correcting coefficient from a command value of the scanning voltage, and a first offset voltage that shifts the electron beam from an optical axial center to the first target region;
detecting electrons emitted from the first target region by an electron detector;
scanning the second target region with the electron beam without moving the stage by applying to the deflector a scanning voltage, which has been corrected by adding a second focus-correcting coefficient to the command value of the scanning voltage or subtracting a second focus-correcting coefficient from the command value of the scanning voltage, and a second offset voltage that shifts the electron beam from the optical axial center to the second target region; and
detecting electrons emitted from the second target region by the electron detector.

* * * * *